(12) United States Patent
Zhang

(10) Patent No.: US 11,296,716 B1
(45) Date of Patent: Apr. 5, 2022

(54) ANALOG MULTIPLEXER WITH CURRENT INJECTION PROTECTION

(71) Applicant: NXP USA, Inc., Austin, TX (US)

(72) Inventor: Wenzhong Zhang, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/112,129

(22) Filed: Dec. 4, 2020

(51) Int. Cl.
*H03M 1/00* (2006.01)
*H03M 1/12* (2006.01)
*H03K 17/56* (2006.01)

(52) U.S. Cl.
CPC .......... *H03M 1/1205* (2013.01); *H03K 17/56* (2013.01)

(58) Field of Classification Search
CPC .... H03M 1/1205; H03M 1/1215; H03M 2/47; H03K 17/56
USPC .......................................... 341/141
See application file for complete search history.

(56) References Cited

U.S. PATENT DOCUMENTS

| | | | | | |
|---|---|---|---|---|---|
| 4,991,140 | A | * | 2/1991 | Wang | G11C 7/22 365/203 |
| 5,818,264 | A | * | 10/1998 | Ciraula | H03K 19/00361 326/98 |
| 6,157,583 | A | * | 12/2000 | Starnes | G11C 29/02 365/200 |
| 7,825,720 | B2 | * | 11/2010 | Ramaraju | G05F 1/56 327/543 |
| 8,487,656 | B1 | * | 7/2013 | Ramaraju | H03K 19/0963 326/98 |
| 8,988,129 | B2 | * | 3/2015 | Pelley | H03K 19/0175 327/333 |
| 9,041,367 | B2 | * | 5/2015 | Dao | G05F 1/573 323/273 |
| 10,601,216 | B2 | | 3/2020 | Muench et al. | |
| 10,680,594 | B2 | * | 6/2020 | Micielli | H03K 5/24 |
| 11,063,590 | B1 | * | 7/2021 | Sanchez | H03K 17/102 |
| 2010/0207687 | A1 | * | 8/2010 | Ramaraju | G11C 5/147 327/543 |
| 2014/0266098 | A1 | * | 9/2014 | Dao | G05F 1/573 323/273 |
| 2015/0054562 | A1 | * | 2/2015 | Pelley | H03K 3/356173 327/333 |

FOREIGN PATENT DOCUMENTS

TW 498616 B 8/2002
TW I481192 B 4/2015

* cited by examiner

*Primary Examiner* — Jean B Jeanglaude

(57) ABSTRACT

A multi-branch analog multiplexer (anamux) includes protection circuitry to help dissipate both positive and negative injected current without increasing the size of hardening transistors in each branch, thereby avoiding increased leakage current and enabling an analog to digital converter to operate with the required accuracy. The protection circuitry is tied to the body of the hardening transistor to lower the threshold voltage of the hardening device, thereby enabling the hardening device to handle more of the injected current.

20 Claims, 2 Drawing Sheets

ANALOG MULTIPLEXER WITH CURRENT INJECTION PROTECTION

FIELD

This invention relates to an analog multiplexer and has particular application to an analog multiplexer with low leakage current and that minimizes effects due to current injection.

BACKGROUND

As CMOS transistor geometries get smaller and smaller, safe operating voltages on the internal transistors get lower. Therefore, inputs and outputs of the devices must use larger geometry transistors in the I/O circuits to protect the device from excessive voltages to prevent damage to the internal logic of the device. Current injection on an analog input pin has additional concerns. Injection current can cause a degradation in the accuracy of the analog-to-digital converter (ADC). In addition, current injection on an analog input may cause errors in adjacent analog channels. The expected injection currents are typically specified in the recommended operating conditions of a device data sheet and are generally in the range of 1 to 5 mA.

An analog mux is commonly used to provide the multiple input into a single ADC input. It is desirable for the analog mux to be able to handle the injected current when disabled. In addition, it is desirable for the analog mux to generate as low as possible leakage current and noise coupling as highly accurate ADCs are commonly required in processing systems, such as microcontrollers and microprocessors embodied in systems on a chip.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Embodiments of analog multiplexers (anamux) disclosed herein function with low leakage and low noise coupling. Both positive and negative current injection are handled by using contesting well biasing even in branches of the anamux that are disabled. The contesting well biasing can be applied to harden both N-type and P-type devices from the effects of current injection. The contesting well biasing provides extra capability to discharge injected current in N-type devices and source the injected circuit in P-type devices while keeping the N-type and P-type hardening devices size relatively small.

Figure 1:
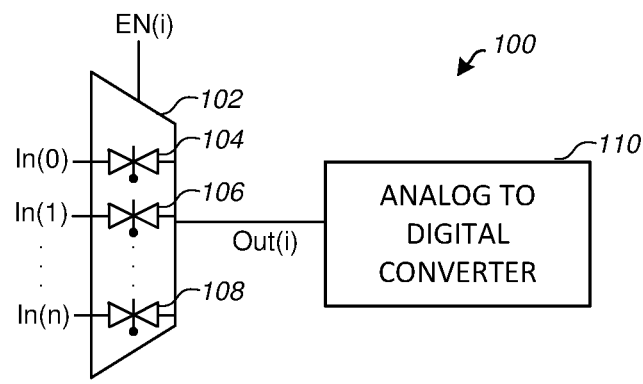
FIG. 1 illustrates a simplified block diagram of an embodiment of an analog multiplexer coupled to an analog to digital converter.

FIG. 1 illustrates a simplified block diagram of an embodiment of input circuit 100 that includes anamux 102 coupled to an analog to digital converter (ADC) 110. Anamux 102 can includes one or more input branches 104, 106, 108, shown as IN0, IN1, . . . INn. Each input branch 104-108 can be enabled one at a time by an indexed enable signal, en(i), independently from the other input branches. When a particular input branch 104-108 is enabled, the output from the enabled branch 104-108 is provided as input to ADC 110.

ADC 110 is an integrated circuit that converts analog signals to digital signals. The digital signals can then be used by a digital processing system (not shown) that performs various processing functions in devices such as cellular phones, laptop computers, desktop computers, tablet computers, gaming systems, industrial control systems for robotics, temperature control, electric grid control, hydroelectrical control, automotive processors for advanced driver assistance systems, infotainment, connectivity, powertrain, braking, car body, driver controls, aircraft, appliances, and many other applications where embedded and non-embedded processing devices may be used.

ADC 110 can be implemented in various architectures such as successive approximation, sigma-delta, or pipeline, among others, and may be selected based on type of application or use, speed, accuracy, linearity, resolution, power supply voltage, and/or other parameters and performance factors.

Figure 2:
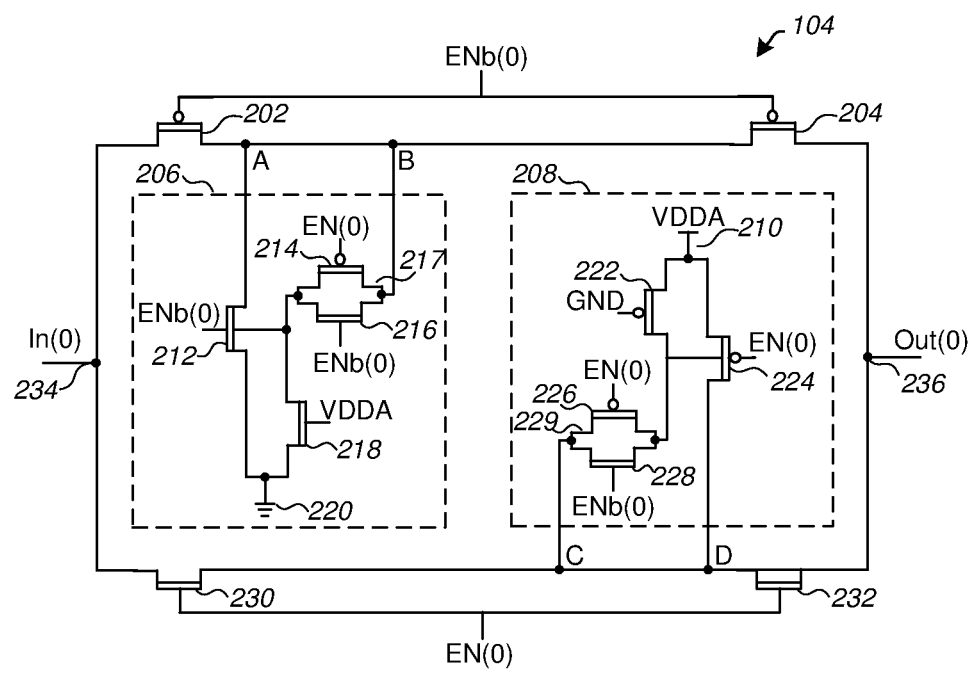
FIG. 2 illustrates a simplified block diagram of an embodiment of a first branch of the analog multiplexer of FIG. 1.

FIG. 2 illustrates a simplified block diagram of an embodiment of a first branch 104 of anamux 102 in FIG. 1 that includes P-type transistors 202, 204 and N-type transistors 230, 232 that behave as transmission gates between input pad 234 and output pad 236. Anamux branch 104 further includes protection circuits 206, 208 that are used when anamux branch 104 is not enabled to either dissipate positive injection current or source negative injection current, thereby preventing the injection current from affecting operation of ADC 110 (FIG. 1). When anamux branch 104 is enabled, protection circuits 206, 208 do not operate, and input from anamux branch 104 is conducted from input pad 234 to outpad 236.

P-type transistor 202 includes a first current electrode coupled to input pad 234, a second current electrode coupled to a net that includes nodes A and B and to a first current electrode of P-type transistor 204. A second current electrode of P-type transistor 204 is coupled to output pad 236. Control gates of P-type transistors 202, 204 are coupled to one another and to a complement of an enable signal shown as ENb(0) for anamux branch 104. Other anamux branches 106, 108 will be coupled to their own respective complement of the enable signal.

N-type transistor 230 includes a first current electrode coupled to input pad 234, a second current electrode coupled to a net that includes nodes C and D, and a first current electrode of N-type transistor 232. A second current electrode of N-type transistor 230 is coupled to output pad 236. Control gates of N-type transistors 230, 232 are coupled to one another and to enable signal shown as EN(0) for anamux branch 104. Other anamux branches 106, 108 will be coupled to their own respective enable signal.

Protection circuit 206 includes N-type transistor 212 including a first current electrode coupled to node A, a second current electrode coupled to ground 220, and a control electrode coupled to the complement of the enable signal. P-type transistor 214 and N-type transistor 216 form transmission gate 217. P-type transistor 214 includes a first current electrode coupled to a first current electrode of N-type transistor 216 and a second current electrode coupled to a second current electrode of N-type transistor 216. The control electrode of P-type transistor 214 is coupled to the enable signal EN(0) and the control electrode of N-type transistor 216 is coupled to the complement of the enable signal ENb(0). The first current electrodes of P-type transistor 214 and N-type transistor 216 are further coupled to a body of N-type transistor 212. The second current electrodes of P-type transistor 214 and N-type transistor 216 are further coupled to nodes A and B, the second current electrode of P-type transistor 202 and the first current electrode of P-type transistor 204.

N-type transistor 218 includes a first current electrode coupled to the body electrode of N-type transistor 212 and the first current electrodes of P-type transistor 214 and N-type transistor 216. N-type transistor 218 further includes a second current electrode coupled to ground 220 and a control electrode coupled to a supply voltage VDDA.

Protection circuit 208 includes P-type transistor 224 including a first current electrode coupled to node D, a second current electrode coupled to supply voltage VDDA, and a control electrode coupled to the enable signal EN(0). P-type transistor 226 and N-type transistor 228 form transmission gate 229. P-type transistor 226 includes a first current electrode coupled to a first current electrode of N-type transistor 228 and a second current electrode coupled to a second current electrode of N-type transistor 228. The control electrode of P-type transistor 226 is coupled to the enable signal EN(0) and the control electrode of N-type transistor 228 is coupled to the complement of the enable signal ENb(0). The first current electrodes of P-type transistor 226 and N-type transistor 228 are further coupled to a body electrode of P-type transistor 224. The second current electrodes of P-type transistor 226 and N-type transistor 228 are further coupled to nodes C and D, the second current electrode of N-type transistor 230, and the first current electrode of N-type transistor 232.

P-type transistor 222 includes a first current electrode coupled to the body electrode of P-type transistor 224 and the first current electrodes of P-type transistor 226 and N-type transistor 228. P-type transistor 222 further includes a second current electrode coupled to supply voltage VDDA 210 and a control electrode coupled to ground.

N-type transistor 212 and P-type transistor 224 may be referred to as "hardening transistors" that are used to dissipate or source current injection. During operation of anamux 102 (FIG. 1), when anamux branch 104 is enabled (EN(0) is asserted and ENb(0) is deasserted), transmission gates 217, 229 are off. The body electrode of N-type transistor 212 is tied to ground 220 by N-type transistor 218. The body electrode of P-type transistor 224 is tied to VDDA by P-type transistor 222 being in conductive mode. Both N-type transistor 212 and P-type transistor 224 will be off. There is no current injection from anamux branch 104 in normal ADC conversion when anamux branch 104 is enabled. Transmission gates 217, 229 and transistors 218, 222, allow the size of transistors 212, 224 to be smaller than would otherwise be needed to remove injection current when anamux branch 104 is not enabled. The smaller transistors 212, 224 produce lower leakage current, which improves the accuracy ADC 110.

In the current injection mode, anamux branch 104 is not enabled (EN(0) is deasserted and ENb(0) is asserted) and transmission gates 217, 229 are on. The body electrode of hardening N-type transistor 212 is still tied to ground by the N-type transistor 218, and is also connected to node A, which is pulled to ground by N-type transistor 212. The body electrode of hardening P-type transistor 224 is still tied to supply voltage VDDA by P-type transistor 222 and is also coupled to node D, which is pulled to VDDA by P-type transistor 224.

During the positive current injection, the input voltage is diode voltage (for example, 0.7~0.8V) above the supply voltage VDDA. The injected current will be discharged to ground through P-type transistor 202 and N-type transistor 212. Due to the small size of N-type transistor 212, node A will be charged to above ground, as a result the threshold voltage of N-type transistor 212 will be reduced due to the body bias effect from transmission gate 217, and N-type transistor 212 is able to handle more channel current. However, the size of N-type transistor 212 may not be able to handle the injected current. Even with threshold voltage shift, node A will rise further, and once node A is above the diode voltage, a body-source diode of N-type transistor 212 starts conducting and is able to discharge the rest of the injected current.

Once the injected current dissipates, the body of the N-type transistor 212 will be pulled back to ground by the always on N-type transistor 218. Accordingly, the 'contesting well biasing' structure is able to handle the injected current. Additionally, the leakage is low due to the small size of N-type transistors 212, 218 and transmission gate 217.

During negative current injection, the input voltage can be diode voltage (0.7~0.8V) below ground 220. The injected negative current can be sourced from supply voltage VDDA through N-type transistor 230 and P-type transistor 224. Due to the small size of P-type transistor 224, node D will be discharged to below supply voltage VDDA. As a result, the threshold voltage of P-type transistor 224 will be reduced due to the body bias effect, and P-type transistor 224 is able to handle more channel current. The size of P-type transistor 224 may not be able to handle the full amount of current injected even with threshold voltage shift. To overcome this possibility, node D will fall further once the diode voltage of node D falls below supply voltage VDDA. At this point, the source-body diode of P-type transistor 224 will start to conduct and source the rest of injected current. Once the injected current dissipates, the body of the P-type transistor 224 will be pulled back to supply voltage VDDA by the always-on P-type transistor 222. Hence the 'contesting well biasing' structure is able to handle the full amount of negative injected current. Additionally, leakage current is low due to the small size of transistors 222, 228 and 224 in protection circuit 208.

Figure 3:
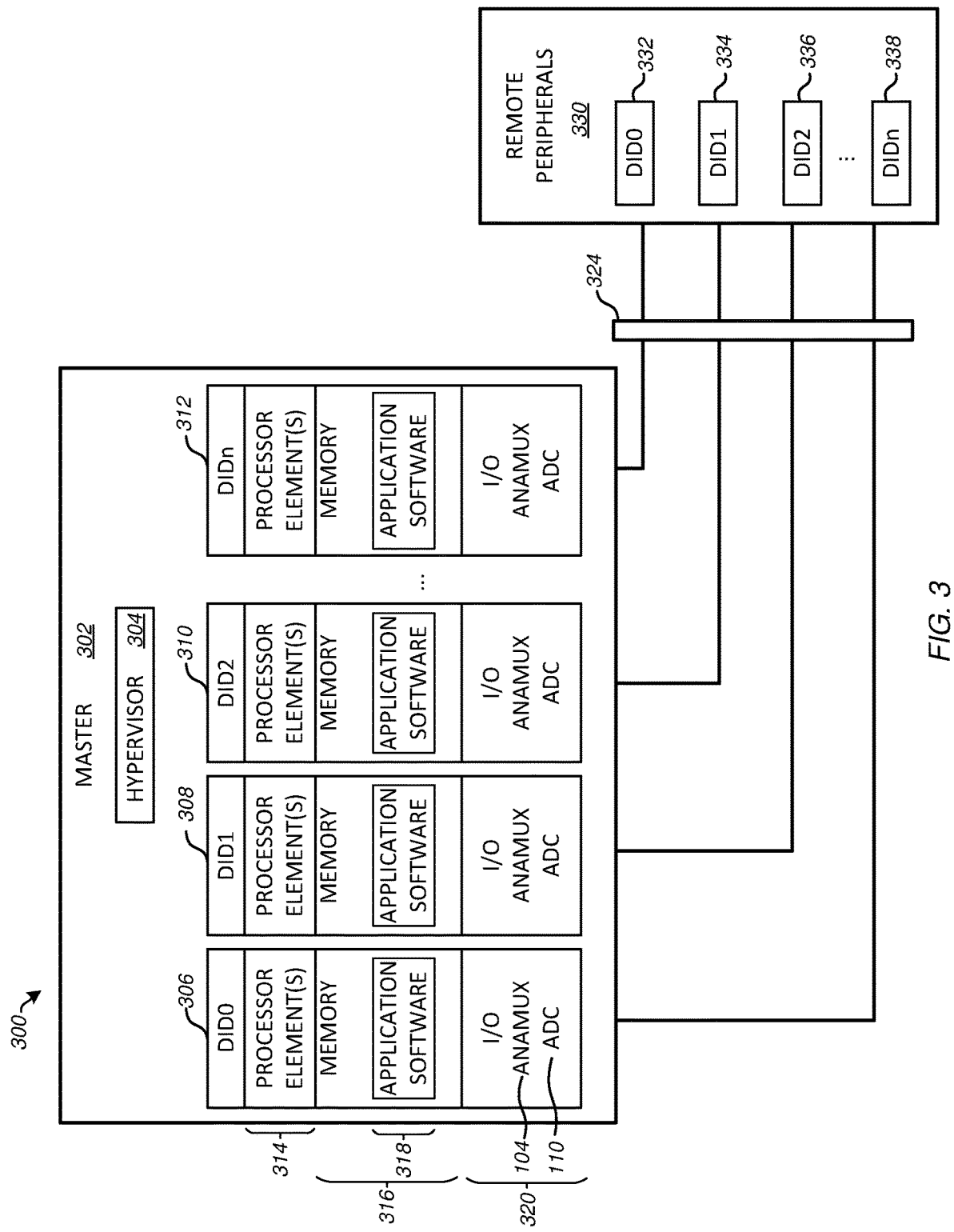
FIG. 3 illustrates a block diagram of an embodiment of a processing system in which the analog multiplexer and analog to digital converter of FIG. 1 can be utilized.

FIG. 3 illustrates a block diagram of an embodiment of a processing system in which the analog multiplexer (anamux) 104 and analog to digital converter (ADC) 110 of FIG. 1 can be utilized. While processing system 300 is provided as an example of the use of anamux 104 and ADC 110, anamux 104 and ADC 110 may be used in processing systems with other architectures and for other purposes.

Processing system 300 can include hypervisor 304, and master device 302 with two or more processors allocated to virtual machines 306, 308, 310, 312. Each virtual machine 306-312 can include all or at least a portion of one or more processor in processor elements 314, memory devices 316 to store bootup and application software 318 and input/output circuitry 320. Other components may be included in processing system 300.

Remote peripherals 330 are coupled to interconnect 324. Each peripheral device may be assigned to a domain identifier as a member of a peripheral device subgroup 332-338, according to the domain in virtual machines 306-312 with which remote peripheral devices 330 are associated. Domain assignments for components in virtual machines 306-312 and remote peripheral devices 330 can be stored in memory 316 in one or more files for domain configuration information (not shown).

Parameters that can be communicated between master device 302 and remote peripherals 330 can include domain identifiers, peripheral addresses, and access attributes such as secure/nonsecure and privileged/nonprivileged attributes, requests for data or other information, responses to requests, among others. Interconnect 324 also routes requests and responses between virtual machines 306-312 and remote peripherals 330.

Hypervisor 304 can create one or more virtual machines 306-312 in processing system 300. Virtual machines 306-312 are private execution environments run by hypervisor 304 and are referred to as domains, each of which can run a different operating system simultaneously on processing system 300. Hypervisor 304 can be implemented in hardware or in software that runs directly on hardware resources such as processor elements 314, memory 316, and input/output (I/O) interface circuitry 320. One of virtual machines 306-312 may be a control domain that runs a full instance of an operating system and the other domains may run a full instance of an operating system that may be different from the operating system running on the control domain or the other guest domains. Hypervisor 304 partitions, shares, manages, and monitors the hardware resources and acts as an interface between the hardware resources and the domains. As such, hypervisor 304 performs the low-level operations required to provide a virtualized platform. The control domain can perform all other tasks. For example, the control domain can determine which guest domains are created, which resources each guest domain can access, and how much memory is allocated to each guest domain. An example of a commercially available product that can be used for hypervisor 304 is the COQOS Hypervisor by OpenSynergy, Inc. in San Diego, Calif., USA. Other suitable hypervisor products can be used, however.

Hypervisor 304 can include a scheduler that schedules domains onto processor elements 314. Each domain, including the control domain, includes one or more virtual processors that it owns and does not share with other domains. Hypervisor 304 may be integrated with a bootloader or work in conjunction with the bootloader to help create the virtual machines 306-312 during boot. The system firmware (not shown) can start the bootloader using a first processor element. The bootloader can load the domain configuration information, kernel images and device trees from a boot partition in memory 316 for virtual machines 306-312.

Once hypervisor 304 configures the virtual machines 308-312, hypervisor 304 can then switch to a hypervisor mode, initialize hypervisor registers, and hand control over to a guest kernel. On the control core, hypervisor 304 can then do the same for the guest that will run on the control core (i.e., initialize the data structures for the guest, switch to the hypervisor mode, initialize hypervisor registers, and hand off control to the guest kernel). After bootup, the distinction between a primary core and a secondary core may be ignored and hypervisor 304 may treat the two cores equally.

Master device 302 may be implemented using a system on a chip (SoC) that includes multiple processing cores, referred to as a multi-core processor. For example, master device 302 can be implemented using a system-on-a-chip with an ARM architecture or any other architecture. In other embodiments, master device 302 may include a multi-core processor that is not a system-on-a-chip to provide the same or a similar environment. For example, a multi-core processor may be a general computing multi-core processor on a motherboard supporting multiple processing cores. In further embodiments, master device 302 may be implemented using a plurality of networked processing cores. In one embodiment, master device 302 may be implemented using a cloud computing architecture or other distributed computing architecture.

Processor elements 314 are virtualized elements that can each include one or more processing cores to perform calculations and general processing tasks, run application software 318, manage I/O interfaces 320, run operating systems, etc. Note that a single processing core can be shared among virtual machines 306-312, and each virtual machine 306-312 can use more than one processing core.

Domains associated with virtual machines 306-312 can be configured for various purposes. For example, in an automobile, domain 306 may be used for a powertrain controller for remote peripherals that can include an engine, transmission, brakes, battery management system, steering, airbags, and suspension. Domain 308 may be used for a body controller for remote peripherals that can include HVAC, mirrors, interior lighting, doors, sears, steering wheel, sunroof, and windshield wipers. Domain 310 may be used for a cockpit controller for remote peripherals that can include touch displays and voice recognition amplifiers. Domain 312 may be used for a connectivity controller for remote peripherals that can include vehicle-to-everything, broadcast radio, cellular, WiFi, Bluetooth, near field communication, and smart car access components. Other domains and functionality can be implemented in processing system 300 for other purposes, with automotive domains being just one example.

In various embodiments, any number and/or type of domains may be supported (e.g., two domains, three domains, five domains, eight domains, . . . sixteen domains, etc.) in addition to or in place of the four domains enumerated herein. In selected embodiments, two or more different operating system environments are provided (e.g., one for each of the domains). Each of the operating system environments may be dedicated to different cores (or multiple cores) of a multi-core system-on-a-chip (SoC). Any number and/or type of operating environments may be provided, and may be used for devices and equipment other than automobiles.

Memory devices 316 can include one or more random access memory (RAM) devices, such as double data rate (DDR) RAM module, quad serial peripheral interface (QUADSPI) memory, system on-chip RAM modules, graphics on-chip RAM module, boot read only memory (ROM) module, and other suitable memory devices.

Application software 318 can be stored in memory 316 that is internal to an SoC, or in a memory device external to master device 302 and loaded into internal memory devices 316 during startup. Various types of application software 318 can be used, depending on the functions to be provided by processing system 300. Using the automotive example described above, application software 318 can include various controllers for remote peripheral devices 330, such as the powertrain domain controller, body domain controller, cockpit domain controller and connectivity domain controller. Other types of application software 188 can be used in addition to or instead of application software 318 related to automotive domains.

Input/output (I/O) circuitry 320 provides a connection between virtual machines 306-312 and remote peripheral devices 330. I/O pins (not shown) are driven by pad drivers that provide for logic level translation, protection against potentially damaging static charges, and amplification of the internal signals to provide sufficient current drive to be useful outside master device 302. I/O circuitry 320 typically includes pads or pins connected to respective input pullup devices, electrostatic discharge protection, input buffers, level shifters, output drivers, and output pulldown devices. anamux 104 and ADC 110 can be included in I/O circuitry 320 to receive analog data from remote peripherals 330 and convert the analog data to digital data that may then be processed by processor elements 314 and stored in memory 316. Other components can be included in I/O circuitry 320.

I/O circuitry 320 can be coupled to interconnect 324 either directly or through a network interface card (not shown). The connection between I/O circuitry 320, interconnect 324, and domain access control 126 can be wired or wireless. Any suitable interconnect technology can be used. For wired networks, an example of a suitable interconnect technology is Ethernet that allows multiple virtual machines 306-312 to communicate with remote peripheral devices 330 and may be implemented using Ethernet cables plugged into an Ethernet switch, router, hub, network bridge, etc. Messages sent to and from interconnect 320 can adhere to a protocol suitable for the interconnect technology being used. When using Ethernet, for example, a stream of data can be divided into frames or packets, also referred to as messages, that each include source and destination addresses, a payload, and error checking so damaged frames can be discarded and replacements retransmitted.

One or more remote peripheral devices 330 may send data to or receive data from portable media devices, data storage devices, servers, mobile phones, radios for AM, FM and digital or satellite broadcast, etc. which are connected through connector hardware such as a one or more USB connectors, firewire connectors, lightning connectors, wireless communications connections for data transfer using infrared communication, Bluetooth communication, ZigBee communication, Wi-Fi communication, communication over a local area network and/or wireless local area network, etc.

For automotive applications, for example, one or more remote peripheral devices 330 may be connected to one or more Local Interconnect Networks (LIN) and/or Controller Area Networks (CAN) to allow communication between vehicle components. Vehicle sensors may be included in remote peripheral devices 330 such as one or more of gyroscopes, accelerometers, three dimensional accelerometers, inclinometers, thermometers, etc. Other remote peripheral devices 330 may be used, in addition to, or instead of, the remote peripherals devices 330 described herein.

By now it should be appreciated that for processing systems and integrated circuitry that use multiple I/O inputs multiplexed into a single ADC channel, anamux 104 can be used to support the mux function with smaller devices and lower leakage current than previously possible. For example, if an ADC channel specifies a +/−3 mA current injection, the MOS transistors may be turned on/conduct earlier than ESD bipolar devices at sub +/−3 mA current injection, due to the lower threshold voltage of I/O circuits. In previous system, the hardening transistors in the anamux had to be large to discharge the injected current. The MOS drivers in the I/O cell could also help discharge over 50% of injection current, but the analog input pad for devices being developed may not include MOS output drivers. Hence the injected current is ideally fully discharged by anamux 104. Yet there are limitations on how large the size of hardening devices in the anamux can be increased without reducing the accuracy required by ADC 110. Embodiments of anamux 104 with protection circuits 206, 208 provide a novel contesting well biasing configuration to discharge the injected current without increasing leakage current.

In some embodiments, an analog multiplexer (MUX) can comprise a plurality of branch circuits, each branch circuit configured to receive a corresponding input signal and provide a corresponding output signal. A multiplexer (MUX) output can be coupled to the plurality of branch circuits, wherein the MUX output is configured to provide the corresponding output signal provided by a selected branch circuit of the plurality of branch circuits as a MUX output signal, each branch circuit of the plurality of branch circuits comprising a first transistor of a first conductivity type having a first current electrode configured to receive the corresponding input signal for the branch circuit, a second current electrode coupled to a circuit node, and a control electrode; a second transistor of the first conductivity type having a first current electrode coupled to the circuit node, a second current electrode configured to provide the corresponding output signal, and a control electrode; a third transistor of a second conductivity type, opposite the first conductivity type, having a first current electrode coupled to the circuit node, a second current electrode coupled to a first voltage supply terminal, and a control electrode, wherein the branch circuit is configured to turn on the third transistor and turn off the first and second transistors when the branch circuit is not selected, and the branch circuit is configured to turn off the third transistor and turn on the first and second transistors when the branch circuit is selected; and a switch circuit coupled between a body electrode of the third transistor and the circuit node, wherein the switch circuit is configured to be conductive when the branch circuit is not selected and non-conductive when the branch circuit is selected.

In other aspects, the analog MUX can further comprise a fourth transistor of the second conductivity type having a first current electrode coupled to the body electrode of the third transistor, a control electrode coupled to a second voltage supply terminal different from the first voltage supply terminal, and a second current electrode coupled to the first voltage supply terminal.

In another aspect, in each branch circuit of the plurality of branch circuits: control electrodes of the first, second, and third transistors can each be coupled to receive an enable signal which is asserted when the branch circuit is selected, and negated when the branch circuit is not selected.

In another aspect, the first conductivity type is N-type, and the first voltage supply terminal provides a first supply voltage that is greater than a second supply voltage provided by the second voltage supply terminal.

In another aspect, the enable signal can be implemented as an active high signal such that it is asserted to a logic level high when the branch circuit is selected and negated to a logic level low when the branch circuit is not selected.

In another aspect, the first conductivity type is P-type, and the first voltage supply terminal provides a first supply voltage that is less than a second supply voltage provided by the second voltage supply terminal.

In another aspect, the enable signal is implemented as an active low signal such that it is asserted to a logic level low when the branch circuit is selected and negated to a logic level high when the branch circuit is not selected.

In another aspect, the switch circuit can comprise a fourth transistor of a third conductivity type having a first current electrode coupled to the body electrode of the third transistor, a second electrode coupled to the circuit node, and a control electrode coupled to receive the enable signal; and a fifth transistor of a fourth conductivity type, opposite the third conductivity type, having a first current electrode coupled to the body electrode of the third transistor, a second electrode coupled to the circuit node, and a control electrode to receive an inverse of the enable signal.

In another aspect, the corresponding input signals, the corresponding output signals, and the MUX output signal can be analog signals.

In another aspect, each branch circuit of the plurality of branch circuits can further comprise: a fourth transistor of the second conductivity type having a first current electrode coupled to receive the corresponding input signal for the branch circuit, a second current electrode coupled to a second circuit node, and a control electrode; and a fifth transistor of the second conductivity type having a first current electrode coupled to the second circuit node, a second current electrode coupled to provide the corresponding output signal, and a control electrode; a sixth transistor of the first conductivity type having a first current electrode coupled to the second circuit node, a second current electrode coupled to the second voltage supply terminal, and a control electrode. The branch circuit can be configured to turn on the sixth transistor and turn off the fourth and fifth transistors when the branch circuit is not selected, and the branch circuit is configured to turn off the sixth transistor and turn on the fourth and fifth transistors when the branch circuit is selected, and a second switch circuit coupled between a body electrode of the sixth transistor and the second circuit node, wherein the second switch circuit is configured to be conductive when the branch circuit is not selected and non-conductive when the branch circuit is selected.

In another aspect, the analog MUX of claim 10 can further comprise a seventh transistor of the first conductivity type having a first current electrode coupled to the body electrode of the sixth transistor, a control electrode coupled to the first voltage supply terminal, and a second current electrode coupled to the second voltage supply terminal.

In another aspect, in each branch circuit of the plurality of branch circuits: control electrodes of the first, second, and third transistors can each be coupled to receive an enable signal which is asserted when the branch circuit is selected, and negated when the branch circuit is not selected; and control electrodes of the fourth, fifth, and sixth transistors are each coupled to receive an inverse of the enable signal.

In other embodiments, a processing system can comprise a processing element; a memory device coupled to the processing element; an input/output (I/O) circuit coupled to the processing element, the I/O circuit including an analog multiplexer, the analog multiplexer including: a plurality of branch circuits, each branch circuit configured to receive a corresponding input signal and provide a corresponding output signal; and a multiplexer output coupled to the plurality of branch circuits. The MUX output can be configured to provide the corresponding output signal provided by a selected branch circuit of the plurality of branch circuits as a MUX output signal, each branch circuit of the plurality of branch circuits can comprise: a first transistor of a first conductivity type having a first current electrode configured to receive the corresponding input signal for the branch circuit, a second current electrode coupled to a circuit node, and a control electrode, a second transistor of the first conductivity type having a first current electrode coupled to the circuit node, a second current electrode configured to provide the corresponding output signal, and a control electrode, a third transistor of a second conductivity type, opposite the first conductivity type, having a first current electrode coupled to the circuit node, a second current electrode coupled to a first voltage supply terminal, and a control electrode. The control electrodes of the first, second, and third transistors can each be coupled to receive an enable signal which is asserted when the branch circuit is selected, and negated when the branch circuit is not selected. The analog multiplexer can further include a fourth transistor of the second conductivity type having a first current electrode coupled to the body electrode of the third transistor, a control electrode coupled to a second voltage supply terminal different from the first voltage supply terminal, and a second current electrode coupled to the first voltage supply terminal, and a switch circuit coupled between a body electrode of the third transistor and the circuit node, wherein the switch circuit is configured to be conductive when the enable signal is negated and non-conductive when the enable signal is asserted.

In other aspects, the switch circuit can comprise a fifth transistor of a third conductivity type having a first current electrode coupled to the body electrode of the third transistor, a second electrode coupled to the circuit node, and a control electrode coupled to receive the enable signal; and a sixth transistor of the fourth conductivity type, opposite the third conductivity type, having a first current electrode coupled to the body electrode of the third transistor, a second electrode coupled to the circuit node, and a control electrode to receive an inverse of the enable signal.

In further embodiments, an integrated circuit device can comprise an analog multiplexer including plurality of branch circuits, each branch circuit can be configured to receive a corresponding input signal and provide a corresponding output signal; and a multiplexer (MUX) output coupled to the plurality of branch circuits. The MUX output can be configured to provide the corresponding output signal provided by a selected branch circuit of the plurality of branch circuits as a MUX output signal, each branch circuit of the plurality of branch circuits can comprise a pair of n-type transistors connected in series between the corresponding input and the corresponding output of the branch circuit, via a first circuit node, wherein control electrodes of each of the pair of n-type transistors can be coupled to receive an enable signal which is asserted when the branch circuit is selected and negated when the branch circuit is not selected. A first p-type transistor can be coupled between the first circuit node and a first voltage supply terminal, wherein a control electrode of the first p-type transistor is coupled to receive the enable signal. A first switch circuit can be coupled between the first circuit node and a body electrode of the first p-type transistor, wherein the switch circuit is configured to be conductive when the enable signal is negated and non-conductive when the enable signal is asserted. A pair of p-type transistors can be connected in series between the corresponding input and the corresponding output of the branch circuit, via a second circuit node, wherein control electrodes of each of the pair of p-type transistors are coupled to receive an inverse of the enable signa. A first n-type transistor can be coupled between the second circuit node and a second voltage supply terminal, wherein a control electrode of the first n-type transistor is coupled to receive the inverse of the enable signal. A second switch circuit can be coupled between the second circuit node and a body electrode of the first n-type transistor, wherein the switch circuit is configured to be conductive when the enable signal is negated and non-conductive when the enable signal is asserted.

In other aspects, the integrated circuit device can further comprise a second p-type transistor coupled between the body electrode of the first p-type transistor and the first voltage supply terminal and having a control electrode coupled to a second voltage supply terminal, wherein the first voltage supply terminal is configured to provide a first supply voltage and the second voltage supply terminal is configured to provide a second supply voltage that is less than the first supply voltage; and a second n-type transistor coupled between the body electrode of the first n-type transistor and the second voltage supply terminal and having a control electrode coupled to the first voltage supply terminal.

In another aspect, the first switch circuit can comprise a third p-type transistor coupled between the first circuit node and the body electrode of the first p-type transistor and having a control electrode coupled to receive the enable signal; and a third n-type transistor coupled in parallel with the second p-type transistor between the first circuit node and the body electrode of the first p-type transistor, and having a control electrode coupled to receive the inverse of the enable signal.

In another aspect, the second switch circuit can comprise a fourth p-type transistor coupled between the second circuit node and the body electrode of the first n-type transistor and having a control electrode coupled to receive the enable signal; and a fourth n-type transistor coupled in parallel with the third p-type transistor between the second circuit node and the body electrode of the first n-type transistor, and having a control electrode coupled to receive the inverse of the enable signal.

In another aspect, the enable signal is implemented as an active high signal such that it is asserted to a logic level high when the branch circuit is selected and negated to a logic level low when the branch circuit is not selected.

In another aspect, the MUX output signal is provided to an analog to digital converter (ADC).

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials maybe reversed.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. An analog multiplexer (MUX), comprising:
   a plurality of branch circuits, each branch circuit configured to receive a corresponding input signal and provide a corresponding output signal; and
   a multiplexer (MUX) output coupled to the plurality of branch circuits, wherein the MUX output is configured to provide the corresponding output signal provided by a selected branch circuit of the plurality of branch circuits as a MUX output signal, each branch circuit of the plurality of branch circuits comprising:
   a first transistor of a first conductivity type having a first current electrode configured to receive the corresponding input signal for the branch circuit, a second current electrode coupled to a circuit node, and a control electrode,
   a second transistor of the first conductivity type having a first current electrode coupled to the circuit node, a second current electrode configured to provide the corresponding output signal, and a control electrode, a third transistor of a second conductivity type, opposite the first conductivity type, having a first current electrode coupled to the circuit node, a second current electrode coupled to a first voltage supply terminal, and a control electrode, wherein the branch circuit is configured to turn on the third transistor and turn off the first and second transistors when the branch circuit is not selected, and the branch circuit is configured to turn off the third transistor and turn on the first and second transistors when the branch circuit is selected, and a switch circuit coupled between a body electrode of the third transistor and the circuit node, wherein the switch circuit is configured to be conductive when the branch circuit is not selected and non-conductive when the branch circuit is selected.

2. The analog MUX of claim 1, further comprising:
a fourth transistor of the second conductivity type having a first current electrode coupled to the body electrode of the third transistor, a control electrode coupled to a second voltage supply terminal different from the first voltage supply terminal, and a second current electrode coupled to the first voltage supply terminal.

3. The analog MUX of claim 1, wherein, in each branch circuit of the plurality of branch circuits:
control electrodes of the first, second, and third transistors are each coupled to receive an enable signal which is asserted when the branch circuit is selected, and negated when the branch circuit is not selected.

4. The analog MUX of claim 3, wherein the first conductivity type is N-type, and the first voltage supply terminal provides a first supply voltage that is greater than a second supply voltage provided by the second voltage supply terminal.

5. The analog MUX of claim 4, wherein the enable signal is implemented as an active high signal such that it is asserted to a logic level high when the branch circuit is selected and negated to a logic level low when the branch circuit is not selected.

6. The analog MUX of claim 3, wherein the first conductivity type is P-type, and the first voltage supply terminal provides a first supply voltage that is less than a second supply voltage provided by the second voltage supply terminal.

7. The analog MUX of claim 6, wherein the enable signal is implemented as an active low signal such that it is asserted to a logic level low when the branch circuit is selected and negated to a logic level high when the branch circuit is not selected.

8. The analog MUX of claim 3, wherein the switch circuit comprises:
a fourth transistor of a third conductivity type having a first current electrode coupled to the body electrode of the third transistor, a second electrode coupled to the circuit node, and a control electrode coupled to receive the enable signal; and
a fifth transistor of a fourth conductivity type, opposite the third conductivity type, having a first current electrode coupled to the body electrode of the third transistor, a second electrode coupled to the circuit node, and a control electrode to receive an inverse of the enable signal.

9. The analog MUX of claim 1, wherein the corresponding input signals, the corresponding output signals, and the MUX output signal are analog signals.

10. The analog MUX of claim 1, wherein each branch circuit of the plurality of branch circuits further comprises:
a fourth transistor of the second conductivity type having a first current electrode coupled to receive the corresponding input signal for the branch circuit, a second current electrode coupled to a second circuit node, and a control electrode, a fifth transistor of the second conductivity type having a first current electrode coupled to the second circuit node, a second current electrode coupled to provide the corresponding output signal, and a control electrode, a sixth transistor of the first conductivity type having a first current electrode coupled to the second circuit node, a second current electrode coupled to the second voltage supply terminal, and a control electrode, wherein the branch circuit is configured to turn on the sixth transistor and turn off the fourth and fifth transistors when the branch circuit is not selected, and the branch circuit is configured to turn off the sixth transistor and turn on the fourth and fifth transistors when the branch circuit is selected, and a second switch circuit coupled between a body electrode of the sixth transistor and the second circuit node, wherein the second switch circuit is configured to be conductive when the branch circuit is not selected and non-conductive when the branch circuit is selected.

11. The analog MUX of claim 10, further comprising:
a seventh transistor of the first conductivity type having a first current electrode coupled to the body electrode of the sixth transistor, a control electrode coupled to the first voltage supply terminal, and a second current electrode coupled to the second voltage supply terminal.

12. The analog MUX of claim 10, wherein, in each branch circuit of the plurality of branch circuits:
control electrodes of the first, second, and third transistors are each coupled to receive an enable signal which is asserted when the branch circuit is selected, and negated when the branch circuit is not selected; and
control electrodes of the fourth, fifth, and sixth transistors are each coupled to receive an inverse of the enable signal.

13. A processing system comprising:
a processing element;
a memory device coupled to the processing element;
an input/output (I/O) circuit coupled to the processing element, the I/O circuit including an analog multiplexer, the analog multiplexer including:
a plurality of branch circuits, each branch circuit configured to receive a corresponding input signal and provide a corresponding output signal; and
a multiplexer output coupled to the plurality of branch circuits, wherein the MUX output is configured to provide the corresponding output signal provided by a selected branch circuit of the plurality of branch circuits as a MUX output signal, each branch circuit of the plurality of branch circuits comprising:
a first transistor of a first conductivity type having a first current electrode configured to receive the corresponding input signal for the branch circuit, a second current electrode coupled to a circuit node, and a control electrode,
a second transistor of the first conductivity type having a first current electrode coupled to the circuit node, a second current electrode configured to provide the corresponding output signal, and a control electrode, a third transistor of a second conductivity type, opposite the first conductivity type, having a first current electrode coupled to the circuit node, a second current electrode coupled to a first voltage supply terminal, and a control electrode, wherein control electrodes of the first, second, and third transistors are each coupled to receive an enable signal which is asserted when the branch circuit is selected, and negated when the branch circuit is not selected, a fourth transistor of the second conductivity type having a first current electrode coupled to the body electrode of the third transistor, a control electrode coupled to a second voltage supply terminal different from the first voltage supply terminal, and a second current electrode coupled to the first voltage supply terminal, and a switch circuit coupled between a body electrode of the third transistor and the circuit node, wherein the switch circuit is configured to be conductive when the enable signal is negated and non-conductive when the enable signal is asserted.

14. The processing system of claim 13, wherein the switch circuit comprises:

a fifth transistor of a third conductivity type having a first current electrode coupled to the body electrode of the third transistor, a second electrode coupled to the circuit node, and a control electrode coupled to receive the enable signal; and a sixth transistor of the fourth conductivity type, opposite the third conductivity type, having a first current electrode coupled to the body electrode of the third transistor, a second electrode coupled to the circuit node, and a control electrode to receive an inverse of the enable signal.

15. An integrated circuit device, comprising:

an analog multiplexer including plurality of branch circuits, each branch circuit configured to receive a corresponding input signal and provide a corresponding output signal; and a multiplexer (MUX) output coupled to the plurality of branch circuits, wherein the MUX output is configured to provide the corresponding output signal provided by a selected branch circuit of the plurality of branch circuits as a MUX output signal, each branch circuit of the plurality of branch circuits comprising:

a pair of n-type transistors connected in series between the corresponding input and the corresponding output of the branch circuit, via a first circuit node, wherein control electrodes of each of the pair of n-type transistors are coupled to receive an enable signal which is asserted when the branch circuit is selected and negated when the branch circuit is not selected;

a first p-type transistor coupled between the first circuit node and a first voltage supply terminal, wherein a control electrode of the first p-type transistor is coupled to receive the enable signal;

a first switch circuit coupled between the first circuit node and a body electrode of the first p-type transistor, wherein the switch circuit is configured to be conductive when the enable signal is negated and non-conductive when the enable signal is asserted;

a pair of p-type transistors connected in series between the corresponding input and the corresponding output of the branch circuit, via a second circuit node, wherein control electrodes of each of the pair of p-type transistors are coupled to receive an inverse of the enable signal;

a first n-type transistor coupled between the second circuit node and a second voltage supply terminal, wherein a control electrode of the first n-type transistor is coupled to receive the inverse of the enable signal; and a second switch circuit coupled between the second circuit node and a body electrode of the first n-type transistor, wherein the switch circuit is configured to be conductive when the enable signal is negated and non-conductive when the enable signal is asserted.

16. The integrated circuit device of claim 15, further comprising:

a second p-type transistor coupled between the body electrode of the first p-type transistor and the first voltage supply terminal and having a control electrode coupled to a second voltage supply terminal, wherein the first voltage supply terminal is configured to provide a first supply voltage and the second voltage supply terminal is configured to provide a second supply voltage that is less than the first supply voltage; and a second n-type transistor coupled between the body electrode of the first n-type transistor and the second voltage supply terminal and having a control electrode coupled to the first voltage supply terminal.

17. The integrated circuit device of claim 16, wherein the first switch circuit comprises:

a third p-type transistor coupled between the first circuit node and the body electrode of the first p-type transistor and having a control electrode coupled to receive the enable signal; and a third n-type transistor coupled in parallel with the second p-type transistor between the first circuit node and the body electrode of the first p-type transistor, and having a control electrode coupled to receive the inverse of the enable signal.

18. The integrated circuit device of claim 17, wherein the second switch circuit comprises:

a fourth p-type transistor coupled between the second circuit node and the body electrode of the first n-type transistor and having a control electrode coupled to receive the enable signal; and a fourth n-type transistor coupled in parallel with the third p-type transistor between the second circuit node and the body electrode of the first n-type transistor, and having a control electrode coupled to receive the inverse of the enable signal.

19. The integrated circuit device of claim 16, the enable signal is implemented as an active high signal such that it is asserted to a logic level high when the branch circuit is selected and negated to a logic level low when the branch circuit is not selected.

20. The integrated circuit device of claim 15, wherein the MUX output signal is provided to an analog to digital converter (ADC).

* * * * *